United States Patent [19]
Chen

[11] Patent Number: 5,489,553
[45] Date of Patent: Feb. 6, 1996

[54] HF VAPOR SURFACE TREATMENT FOR THE 03 TEOS GAP FILLING DEPOSITION

[75] Inventor: Lai-Juh Chen, Hsin-chu, Taiwan

[73] Assignee: Industrial Technology Research Institute, Hsinchu, Taiwan

[21] Appl. No.: 450,410

[22] Filed: May 25, 1995

[51] Int. Cl.$^6$ .......................... H01L 21/283; H01L 21/31
[52] U.S. Cl. .................. 437/195; 437/238; 148/DIG. 17; 134/11
[58] Field of Search .................................... 437/195, 228, 437/238, 225; 134/11; 148/DIG. 17

[56] References Cited

U.S. PATENT DOCUMENTS

| | | | |
|---|---|---|---|
| 4,872,947 | 10/1989 | Wang et al. | 156/643 |
| 5,051,380 | 9/1991 | Maeda et al. | 437/238 |
| 5,069,747 | 12/1991 | Cathey et al. | 156/643 |
| 5,089,441 | 2/1992 | Moslehi | 437/225 |
| 5,169,791 | 12/1992 | Muenzer | 437/13 |
| 5,194,397 | 3/1993 | Cook et al. | 437/31 |
| 5,231,058 | 7/1993 | Maeda et al. | 437/235 |
| 5,248,380 | 9/1993 | Tanaka | 156/626 |
| 5,282,925 | 2/1994 | Jeng et al. | 156/626 |
| 5,314,845 | 5/1994 | Lee et al. | 437/238 |
| 5,334,554 | 8/1994 | Lin et al. | 437/231 |
| 5,352,630 | 10/1994 | Kim et al. | 437/195 |
| 5,380,399 | 1/1995 | Miyashita et al. | 156/646 |
| 5,399,529 | 3/1995 | Homma | 437/195 |
| 5,426,076 | 6/1995 | Moghadam | 437/238 |
| 5,436,188 | 7/1995 | Chen | 437/52 |

OTHER PUBLICATIONS

Wong, M., et al., "Characterization of Wafer Cleaning and Oxide Etching Using Vapor–Phase Hydrogen Fluoride", J. Electrochem. Soc., vol. 138, No. 6, Jun. 1991, pp. 1779–1802.
"Dependence of Film Properties of Subatomospheric Pressure Chemical Vapor Deposited Oxide on Ozone to–Tetraethylor–thosilicate Ratio" by Judy Huang et al., J. Electrochem Soc. vol. 140, No. 6, Jun. 1993 pp. 1682–1686.

Primary Examiner—T. N. Quach
Attorney, Agent, or Firm—George O. Saile; Rosemary L. S. Pike

[57] ABSTRACT

An improved method of gap filling in the dielectric layer using an HF surface treatment is described. Semiconductor device structures are provided in and on a semiconductor substrate wherein the top surfaces of the semiconductor device structures are planarized. A conducting layer is deposited overlying the planarized surface of the semiconductor substrate and patterned. A first oxide layer is conformally deposited over the surfaces of the patterned conducting layer wherein a gap remains between portions of the first oxide layer covering the patterned conducting layer. The surface of the first oxide layer is treated with HF vapor whereby SiOF molecules are formed on the surface of the first oxide layer. A second oxide layer is deposited over the first oxide layer wherein the presence of the SiOF molecules improves the step coverage of the second oxide layer so that the gap is filled by the second oxide layer.

14 Claims, 2 Drawing Sheets

HF VAPOR SURFACE TREATMENT FOR THE O3 TEOS GAP FILLING DEPOSITION

BACKGROUND OF THE INVENTION

(1) Field of the Invention

The present invention relates to the fabrication of integrated circuit devices, and more particularly, to a method of improving the gap filling characteristics of the dielectric layer during metallization in the fabrication of integrated circuits.

(2) Description of the Prior Art

In the fabrication of integrated circuit devices, semiconductor device structures such as gate electrodes and source and drain regions are typically formed in and on a semiconductor substrate. An insulating layer is deposited over the surface of the substrate and planarized. Next, a metal conducting layer is deposited and patterned to contact the underlying semiconductor device structures. A dielectric layer is deposited overlying the metal conducting layer and further conducting layers may be formed. As the packing density of semiconductor devices increases, the size of the gap between the patterned metal areas decreases. FIG. 1 illustrates a partially completed integrated circuit device. Semiconductor substrate 10 which may contain semiconductor device structures and a planarized insulating surface 11 is shown. Metal layer 12 has been deposited and patterned. Gap 15 between the patterned metal areas is to be filled by dielectric layer 14. The dielectric layer 14 is typically a tetraethoxysilane (TEOS) oxide deposited by chemical vapor deposition (CVD). This deposition technology is subject to arrival angle effect or shadowing effect. That is, the deposition rate of the dielectric material is faster in the corner regions 16 than in other regions. If the oxide thickness is large enough, the corner portions of the dielectric material 16 will meet causing a void to form within the gap. This is detrimental to device operation. It is desired to find a gap-filling technique which will completely fill a gap between patterned metal areas without the presence of voids.

U.S. Pat. No. 4,872,947 to Wang, U.S. Pat. No. 5,069,747 to Cathey et al, and U.S. Pat. No. 5,231,058 to Maeda et al describe $O_3$-TEOS or $O_3$-OMCTS processes. The patent to Cathey et al uses dilute HF to remove $O_3$-TEOS structures. U.S. Pat. No. 5,169,791 to Muenzer discloses the passivation of crystal defects using atomic hydrogen. U.S. Pat. No. 5,194,397 to Cook et al and U.S. Pat. No. 5,089,441 to Moslehi disclose the use of HF to remove native oxide. The paper, "Dependence of Film Properties of Subatmospheric Pressure Chemical Vapor Deposited Oxide on Ozone-to-Tetraethylorthosilicate Ratio" by Judy Huang et al, *J. Electrochem. Soc.*, Vol. 140, No. 6, June 1993, pp. 1682–1686, states that subatmospheric pressure chemically vapor deposited (SACVD) oxide can fill a gap of 4000 Angstroms between metal lines.

SUMMARY OF THE INVENTION

Accordingly, it is a primary object of the present invention to provide a process for improving the gap filling characteristics of the dielectric layer in the fabrication of integrated circuits.

It is a further object of the invention to provide a process for improving the step coverage of $O_3$-TEOS on a patterned metal layer.

Yet another object is to provide a process which fills a gap of greater than or equal to 1800 Angstroms with an aspect ratio less than or equal to 3.

In accordance with the objects of the invention, an improved method of gap filling in the dielectric layer using an HF surface treatment is achieved. Semiconductor device structures are provided in and on a semiconductor substrate wherein the top surfaces of the semiconductor device structures are planarized. A conducting layer is deposited overlying the planarized surface of the semiconductor substrate and patterned. A first oxide layer is conformally deposited over the surfaces of the patterned conducting layer wherein a gap remains between portions of the first oxide layer covering the patterned conducting layer. The surface of the first oxide layer is treated with HF vapor whereby SiOF molecules are formed on the surface of the first oxide layer. A second oxide layer is deposited over the first oxide layer wherein the presence of the SiOF molecules improves the step coverage of the second oxide layer so that the gap is filled by the second oxide layer.

BRIEF DESCRIPTION OF THE DRAWINGS

In the accompanying drawings forming a material part of this description, there is shown.

DESCRIPTION OF THE PREFERRED EMBODIMENTS

Figure 1:
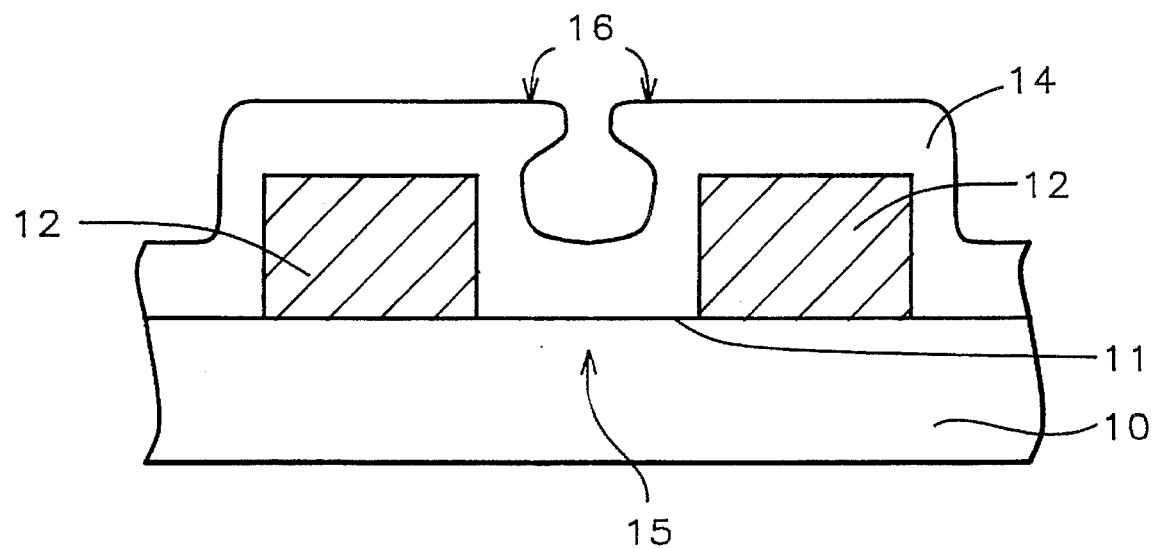
FIG. 1 is a cross-sectional representation of a gap-filling technique of the prior art.
Figure 2:
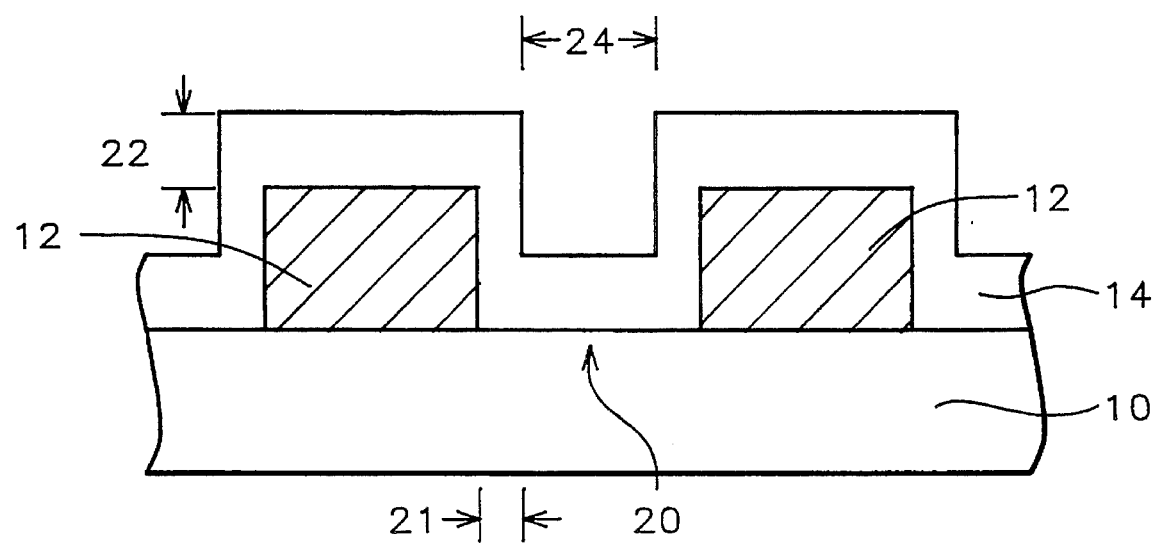
FIGS. 2 through 4 are cross-sectional representations of a preferred embodiment of the present invention.

Referring now more particularly to FIG. 2, there is shown a semiconductor substrate 10, in which may be formed semiconductor device structures which may include polysilicon gate electrodes and source and drain regions. A layer of conducting material 12 has been deposited over the planarized surface of the semiconductor substrate and patterned. The conducting material may be a metal such as Aluminum, AlCu, AlSiCu, or Cu.

A layer of tetraethoxysilane (TEOS) oxide 14 is deposited by plasma enhanced chemical vapor deposition (PECVD) over the surface of the patterned conducting layer, according to a standard recipe. This first oxide layer protects the metal lines 12 and provides a substrate for the subsequent HF treatment. For narrow or steep geometries, such as a gap 20 of between about 5000 to 7000 Angstroms between portions of the patterned conducting layer, the oxide layer 14 tends to deposit so that the side layer 21 has a lesser thickness than that of the top layer 22. For a top layer thickness 22 of between about 3000 to 4100 Angstroms, the side layer thickness 21 would be between about 1950 to 2600 Angstroms, leaving a gap between the sidewall layers between patterned conducting layer portions of between about 1800 to 2500 Angstroms. This is a smaller gap than that discussed in the literature as cited hereinabove.

Figure 3:
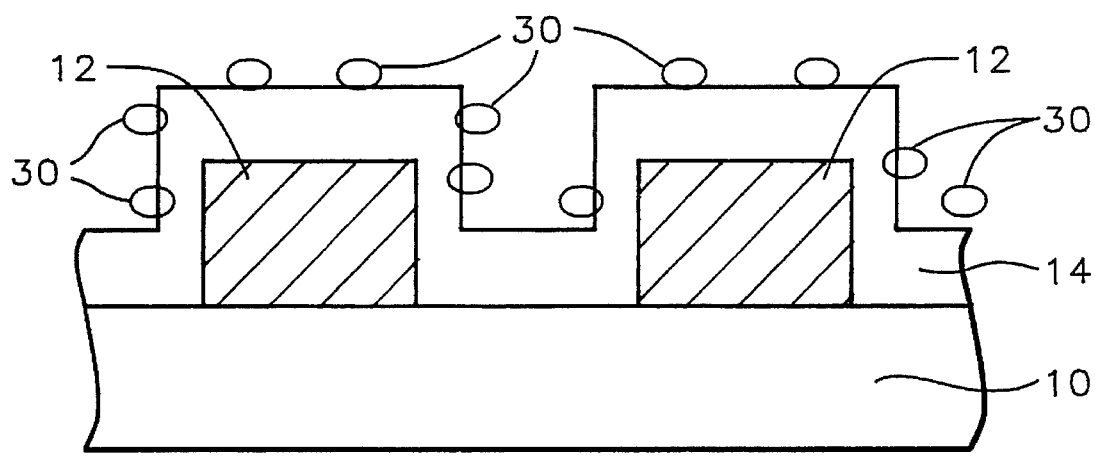

Referring now to FIG. 3, the vapor surface treatment of the present invention will be described. The wafer is subjected to a flow of about 30% HF vapor in the range of between about 0.5 to 5 slm (standard liter/minute) at a temperature of about 25° C. under a pressure of between about 150 to 500 Torr for between about 10 to 25 seconds. A vapor HF machine, such as the Edge 2002 by Advantage of Sunnyvale, CA may be used. This HF vapor treatment etches away a very small portion of the dielectric layer 14 and results in SiOF bonding on the oxide surface. A HF vapor surface treatment of 30 seconds duration was tried, but that resulted in an unacceptable etching of the silicon oxide surface. A treatment of not longer than about 25 seconds results in an acceptable etching of the silicon oxide surface and the formation of SiOF molecules 30 on the surface of the oxide layer 14. The SiOF molecules on the surface of the dielectric layer 14 will help the flow of the TEOS precursor during $O_3$-TEOS deposition and hence improve the step coverage of the $O_3$-TEOS.

Figure 4:
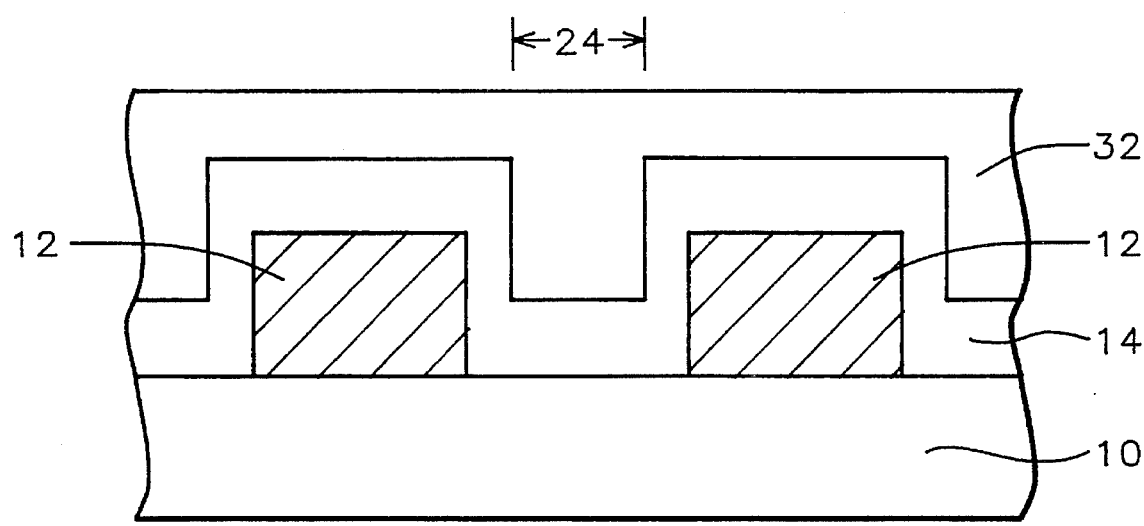

Referring now to FIG. 4, a second oxide layer 32 is deposited overlying oxide layer 14 by atmospheric pressure chemical vapor deposition (APCVD) or SACVD of $O_3$-TEOS. The presence of the SiOF molecules improves the step coverage of the $O_3$-TEOS layer 32.

The process of the invention was actually performed and resulted in the complete filling of a gap between patterned conducting layer portions 24 as narrow as 1800 Angstroms, as shown by scanning electron microscope (SCM).

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit comprising:

providing semiconductor device structures in and on a semiconductor substrate wherein the top surfaces of said semiconductor device structures are planarized;

depositing a conducting layer overlying the surfaces of said semiconductor device structures and patterning said conducting layer;

conformally depositing a first TEOS oxide layer over the surfaces of patterned said conducting layer wherein a gap remains between portions of said first TEOS oxide layer covering said patterned conducting layer;

treating the surface of said first oxide layer with HF vapor whereby SiOF molecules are formed on the surface of said first oxide layer;

depositing a second TEOS oxide layer over said first TEOS oxide layer wherein said gap is filled by said second TEOS oxide layer; and completing the fabrication of said integrated circuit.

2. A method according to claim 1 wherein said first TEOS oxide layer comprises plasma enhanced TEOS oxide.

3. A method according to claim 1 wherein said gap is between about 1800 to 2500 Angstroms wide.

4. A method according to claim 1 wherein said treating said surface with HF vapor comprises an HF vapor flow rate of between about 0.5 to 5 slm under a pressure of between about 150 to 500 Torr for a duration of between about 10 to 25 seconds.

5. A method according to claim 1 wherein said SiOF molecules improve the step coverage of subsequent said second TEOS oxide layer deposition.

6. A method according to claim 1 wherein said second TEOS oxide layer comprises atmospheric pressure deposited $O_3$-TEOS.

7. A method of manufacturing an integrated circuit comprising:

providing semiconductor device structures in and on a semiconductor substrate wherein the top surfaces of said semiconductor device structure are planarized;

depositing a conducting layer overlying the surfaces of said semiconductor device structures and patterning said conducting layer;

conformally depositing a first TEOS oxide layer over the surfaces of patterned said conducting layer wherein a gap of greater than 1800 Angstroms remains between portions of said first TEOS oxide layer covering said patterned conducting layer;

treating the surface of said first TEOS oxide layer with HF vapor whereby SiOF molecules are formed on the surface of said first oxide layer;

depositing a second oxide TEOS layer over said first TEOS oxide layer wherein the presence of said SiOF molecules improves the step coverage of said second TEOS oxide layer so that said gap is filled by said second TEOS oxide layer; and completing the fabrication of said integrated circuit.

8. A method according to claim 7 wherein said first TEOS oxide layer comprises plasma enhanced TEOS oxide.

9. A method according to claim 7 wherein said treating said surface with HF vapor comprises an HF vapor flow rate of between about 0.5 to 5 slm under a pressure of between about 150 to 500 Torr for a duration of between about 10 to 25 seconds.

10. A method according to claim 7 wherein said second TEOS oxide layer comprises atmospheric pressure deposited $O_3$-TEOS.

11. A method of manufacturing an integrated circuit comprising:

providing semiconductor device structures in and on a semiconductor substrate wherein the top surfaces of said semiconductor device structures are planarized;

depositing a conducting layer overlying the surfaces of said semiconductor device structures and patterning said conducting layer;

conformally depositing a first TEOS oxide layer over the surfaces of said conducting layer wherein a gap is formed between portions of said patterned conducting layer;

treating the surface of said first TEOS oxide layer with HF vapor at a flow rate of between about 0.5 to 5 slm under a pressure of between about 150 to 500 Torr for a duration of between about 10 to 50 seconds whereby SiOF molecules are formed on the surface of said first TEOS oxide layer;

depositing a second TEOS oxide layer over said first TEOS oxide layer wherein the presence of said SiOF molecules improves the step coverage of said second TEOS oxide layer so that said gap is filled by said second TEOS oxide layer; and completing the fabrication of said integrated circuit.

12. A method according to claim 11 wherein said first TEOS oxide layer comprises plasma enhanced TEOS oxide.

13. A method according to claim 11 wherein said gap is between about 1800 to 2500 Angstroms wide.

14. A method according to claim 11 wherein said second TEOS oxide layer comprises atmospheric pressure deposited $O_3$-TEOS.

* * * * *